United States Patent
Yan et al.

(10) Patent No.: US 10,483,239 B2
(45) Date of Patent: Nov. 19, 2019

(54) SEMICONDUCTOR DEVICE INCLUDING DUAL PAD WIRE BOND INTERCONNECTION

(71) Applicant: SANDISK SEMICONDUCTOR (SHANGHAI) CO., LTD., Shanghai (CN)

(72) Inventors: Junrong Yan, Shanghai (CN); Xiaofeng Di, Shanghai (CN); Harjashan Singh, New York, NY (US); Gokul Kumar, San Jose, CA (US); Chee Keong Chin, Shanghai (CN); Ming Xia Wu, Shanghai (CN); Jian Bin Gu, Shanghai (CN)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/907,600

(22) Filed: Feb. 28, 2018

(65) Prior Publication Data

US 2018/0190621 A1     Jul. 5, 2018

Related U.S. Application Data

(63) Continuation-in-part of application No. 15/630,712, filed on Jun. 22, 2017, now Pat. No. 10,128,218.

(30) Foreign Application Priority Data

Dec. 20, 2016   (CN) .......................... 2016 1 1187727
Dec. 20, 2017   (CN) .......................... 2017 1 1381575

(51) Int. Cl.
*H01L 21/60*   (2006.01)
*H01L 25/065*  (2006.01)
*H01L 23/00*   (2006.01)

(52) U.S. Cl.
CPC .......... *H01L 25/0657* (2013.01); *H01L 24/09* (2013.01); *H01L 24/48* (2013.01);
(Continued)

(58) Field of Classification Search
CPC ...................................................... H01L 21/304
See application file for complete search history.

(56) References Cited

U.S. PATENT DOCUMENTS 5,003,374 A    3/1991  Vokoun, III
6,180,891 B1   1/2001  Murdeshwar
(Continued)

FOREIGN PATENT DOCUMENTS

JP      2005191334 A  *  7/2005

OTHER PUBLICATIONS

Office Action dated Mar. 21, 2018 in U.S. Appl. No. 15/630,712, 11 pages.
(Continued)

*Primary Examiner* — George R Fourson, III
(74) *Attorney, Agent, or Firm* — Vierra Magen Marcus LLP (57) ABSTRACT

A semiconductor device is disclosed including semiconductor die formed with a row of functional die bond pads and an adjacent row of dummy die bond pads. The functional die bond pads may be electrically connected to the integrated circuits formed within the semiconductor die. The dummy die bond pads may be formed in the scribe area of a semiconductor wafer from which the semiconductor die are formed, and are provided for wire bonding the semiconductor die within the semiconductor device.

22 Claims, 9 Drawing Sheets

(52) U.S. Cl.
CPC ............... *H01L 2224/09515* (2013.01); *H01L 2224/48145* (2013.01); *H01L 2225/0651* (2013.01); *H01L 2225/06506* (2013.01); *H01L 2225/06562* (2013.01)

(56) References Cited

U.S. PATENT DOCUMENTS

| | | | |
|---|---|---|---|
| 6,900,528 B2 | 5/2005 | Mess et al. | |
| 7,517,726 B1 | 4/2009 | Tan et al. | |
| 8,203,215 B2 | 6/2012 | Sasaki et al. | |
| 8,367,522 B1* | 2/2013 | Yang | H01L 23/488 257/688 |
| 2004/0043535 A1* | 3/2004 | Jeung | H01L 23/3114 438/109 |
| 2004/0245637 A1* | 12/2004 | Horak | H01L 21/7682 257/758 |
| 2005/0062166 A1* | 3/2005 | Kang | H01L 24/48 257/777 |
| 2006/0001144 A1 | 1/2006 | Uehling et al. | |
| 2008/0006921 A1* | 1/2008 | Park | H01L 23/3128 257/686 |
| 2008/0272368 A1* | 11/2008 | Do | H01L 21/568 257/40 |
| 2008/0272476 A1* | 11/2008 | Do | H01L 21/6835 257/686 |
| 2008/0296570 A1 | 12/2008 | Chen et al. | |
| 2009/0026620 A1 | 1/2009 | Ohta | |
| 2009/0325344 A1 | 12/2009 | Takiar et al. | |
| 2011/0079912 A1* | 4/2011 | Marcoux | H01L 23/481 257/773 |
| 2011/0155435 A1* | 6/2011 | Mohammed | H05K 1/181 174/261 |
| 2015/0108645 A1* | 4/2015 | Daubenspeck | H01L 21/76802 257/751 |
| 2016/0133585 A1 | 5/2016 | Kwon et al. | |
| 2017/0256509 A1 | 9/2017 | Lee et al. | |

OTHER PUBLICATIONS

Notice of Allowance and Fee(s) Due dated Aug. 24, 2018 in U.S. Appl. No. 15/630,712, 9 pages.

Response to Office Action filed Jul. 6, 2018 in U.S. Appl. No. 15/630,712, 11 pages.

* cited by examiner

SEMICONDUCTOR DEVICE INCLUDING DUAL PAD WIRE BOND INTERCONNECTION

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Semiconductor memory may be provided within a semiconductor package, which protects the semiconductor memory and enables communication between the memory and a host device. Examples of semiconductor packages include system-in-a-package (SiP) or multichip modules (MCM), where a plurality of die are mounted and interconnected on a small footprint substrate. The die in the stack are typically wire bonded to each other and the substrate to allow signal exchange to/from select die in the die stack.

Conventional wire bonding techniques form a loop from a die bond pad on one die to a die bond pad on the next adjacent die, and repeating the process up the entire die stack and across all die bond pads on each die. Conventional bonding techniques form wire bond loops to a height of over 120 µm. As the number of semiconductor die in a die stack increase, the height of the wire bonds is becoming a limiting factor in a number of die that may be included in a package. Additionally, forming a loop in the wire bonds increases the likelihood that one or more wire bonds can bend during fabrication and electrically short against the next adjacent wire bond.

DETAILED DESCRIPTION

The present technology will now be described with reference to the figures, which in embodiments, relate to a semiconductor device including semiconductor die formed with a row of functional die bond pads and an adjacent row of dummy die bond pads. The functional die bond pads may be electrically connected to the integrated circuits formed within the semiconductor die. The dummy die bond pads may be formed in the scribe area of a semiconductor wafer from which the semiconductor die are formed. When the wafer is diced, for example in a stealth dice before grinding process, the row of dummy die bond pads are severed in the scribe area, leaving a portion of the dummy die bond pads exposed at an edge of the diced semiconductor die. Corresponding functional and dummy die bond pads may be electrically connected to each other, for example using a redistribution layer (RDL) pattern of traces between respective pairs of functional and dummy die bond pads.

After a number of such semiconductor die are stacked together on a substrate, wire bonds may be formed using the dummy die bond pads to connect each of the die in the stack with each other and the substrate. Having die bond pads at the edge of the die minimizes the offset between die when stacked into a package. In addition to minimizing the footprint of the die stack, minimizing the die offset also minimizes the height of the formed wire bonds.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
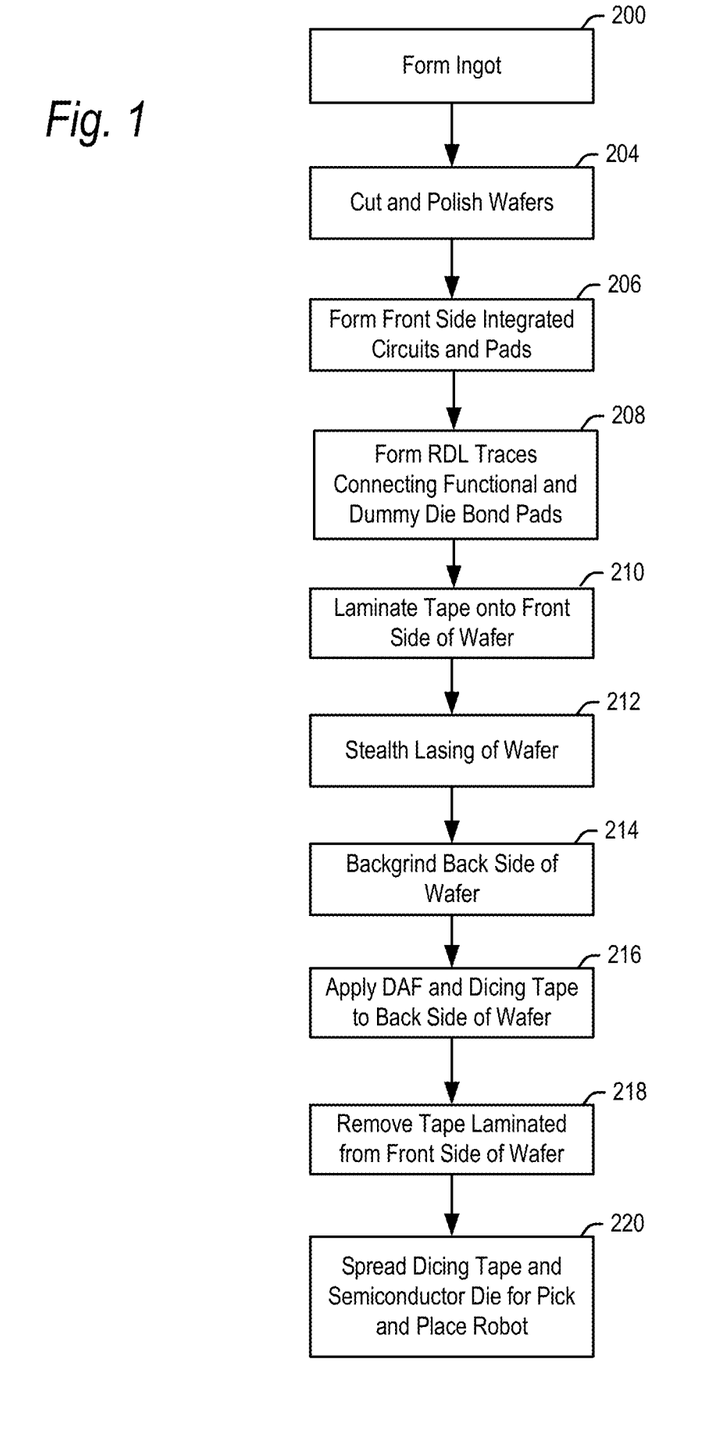
FIG. 1 is a flowchart for forming a semiconductor die according to embodiments of the present technology.

An embodiment of the present technology will now be explained with reference to the flowcharts of FIGS. 1 and 8, and the views of FIGS. 2-7 and 9-14. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 (FIG. 6) opposite surface 102, to provide smooth surfaces. In step 206, the first major surface 102 may undergo various processing steps to divide the wafer 100 into respective semiconductor die 106 (FIGS. 2 and 3), and to form integrated circuits of the respective semiconductor die 106 on and/or in the first major surface 102. These various processing steps may include metallization steps depositing metal contacts including functional die bond pads 108 and dummy die bond pads 110 exposed on the first major surface 102 as explained below. The metallization steps may further include depositing metal interconnect layers and vias within the wafer. These metal interconnect layers and vias may be provided for transferring signals to and from the integrated circuits, and to provide structural support to the integrated circuits as explained below.

Figure 2:
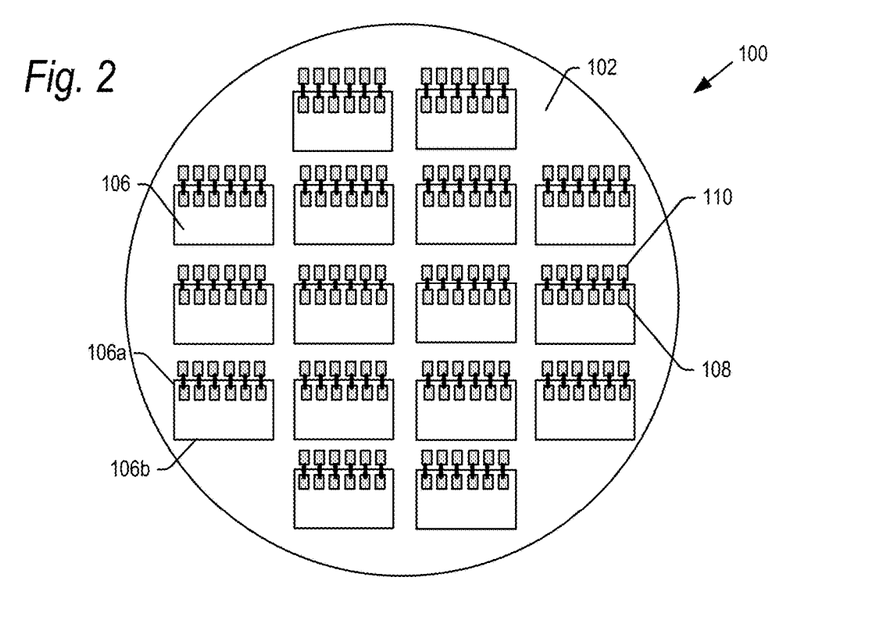
FIG. 2 is a front view of a semiconductor wafer showing a first major surface of the wafer.

The number of semiconductor die 106 shown on wafer 100 in FIG. 2 is for illustrative purposes, and wafer 100 may include more semiconductor die 106 than are shown in further embodiments. Similarly, the number of bond pads 108, 110 on each semiconductor die 106 are shown for illustrative purposes, and each die 106 may include more die bond pads than are shown in further embodiments. Each semiconductor die 106 may include a proximal end 106a including the bond pads 108, and a distal end 106b opposite the proximal end 106a. The die bond pads 108, 110 may for example be formed of aluminum, or alloys thereof, but the die bond pads 108, 110 may be formed of other materials in further embodiments. In embodiments, the integrated circuits may operate as NAND flash memory semiconductor die, though other types of integrated circuits are contemplated.

The semiconductor die 106 are formed on wafer 100 in rows and columns which are spaced apart from each other by vertical and horizontal scribe lines 112 provided between semiconductor die 106 on wafer 100. The scribe lines 112 are reserved as a border around active areas of the semiconductor die where a cut may be made to separate the semiconductor die from each other and the wafer 100. In traditional dicing techniques such as sawing, material is removed from the wafer during the cut, and the cut is also not precisely controllable. Thus, the width of a scribe line 112 may for example range between 70 µm and 170 µm. Scribe lines 112 to be wider or narrower than that in further embodiments. As explained below, current dicing methods such as stealth dicing before grinding provide for much tighter tolerances and can be controlled to within a few microns.

In accordance with aspects of the present technology, the row of functional die bond pads 108 may be formed in each semiconductor die 106 spaced from the eventual proximal edge 106a of the semiconductor die. As noted, the functional die bond pads 108 may be routed by internal electrical interconnects to the integrated circuits defined within the semiconductor die 106, and are used to transfer signals to and from the integrated circuits.

Figure 3:
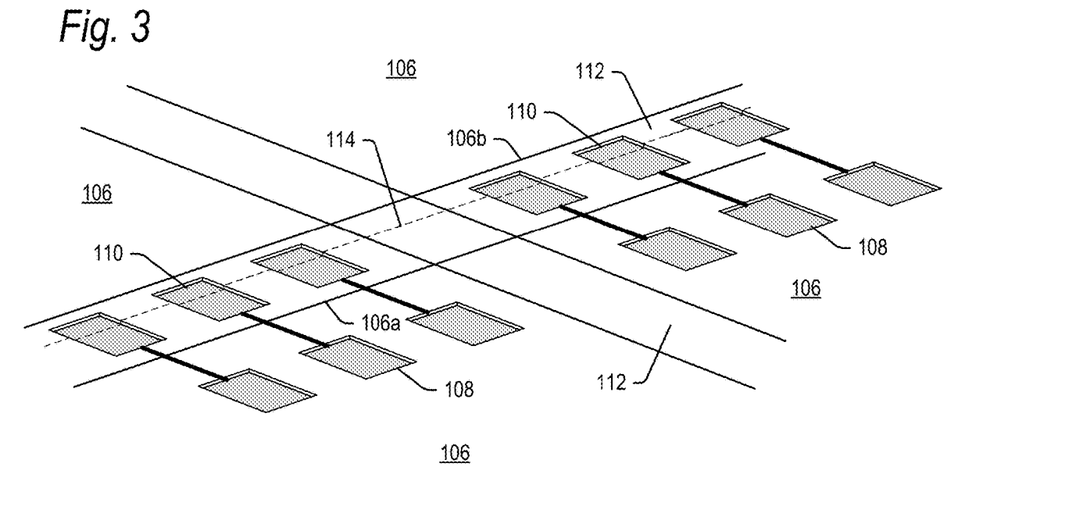
FIG. 3 is an enlarged view of a portion of the wafer showing die bond pads formed on a portion of the wafer.

In accordance with further aspects of the present technology, the row of dummy die bond pads 110 may be formed on each semiconductor die at least partially within the scribe lines 112 provided between semiconductor die 106 on wafer 100. FIG. 3 is a perspective view showing a portion of the first major surface 102 of the wafer 100. As shown, the row of dummy die bond pads 110 may be formed within the scribe line 112 between the proximal and distal edges 106a, 106b of adjacent rows of semiconductor die 106.

As explained below, it is a feature of the dummy die bond pads 110 that they are formed entirely within scribe lines 112, so as not to undermine the structural integrity of a seal ring formed beneath functional die bond pads 108 as explained below. However, it is conceivable that a small portion of a row of dummy die bond pads 110 (e.g., 30 µm) may extend out of the scribe line 112 and into the active area of semiconductor die 106 in further embodiments.

In embodiments, each functional die bond pad 108 may have a length and width of approximately 50 µm, though the length and width of pads 108 may vary in further embodiments, proportionately or disproportionately to each other. Each dummy die bond pad 110 may have a length and width of approximately 70 µm by 60 µm, though the length and width of pads 110 may vary in further embodiments, proportionately or disproportionately to each other.

In accordance with aspects of the present technology, the dummy die bond pads 110 are severed along dicing line 114 when the semiconductor die are diced from the wafer. As explained below, embodiments of the present technology use stealth dicing before grinding, which is a precise cutting method that removes little or none of the wafer when dicing the wafer. FIG. 3 further shows horizontal dicing lines 114 indicating the lines along which die 106 will be cut from wafer 100. As shown, the die 106 may be cut so that portions of the scribe lines 112 remain as a border around each semiconductor die. The amount of the dummy die bond pad that may remain in proximal edge 106a as part of die 106 after cutting along dicing line 114 may vary, but in embodiments, may be 30 µm to 60 µm. The portions of dummy die bond pads 110 remaining after dicing may be greater or lesser than that amount in further embodiments. After dicing, a residual portion of each dummy die bond pad 110 may remain unused in the distal end 106b of the semiconductor die 106.

In step 208, each functional die bond pad 108 may be electrically coupled to the corresponding dummy die bond pad 110, for example using a redistribution layer (RDL) trace 118 formed between each functional and dummy die bond pair. The redistribution layer may be formed by depositing a passivation layer on the surface of the wafer, and etching the passivation layer to expose the functional and dummy die bond pads 108, 110. Thereafter, the metal trace 118, etched or printed on top of the passivation layer, between the respective functional and dummy die bond pairs. In embodiments, a further passivation layer may be formed on top of the traces in the space between the functional and dummy die bond pairs. Further details of the RDL traces 118 are explained below.

Figure 4:
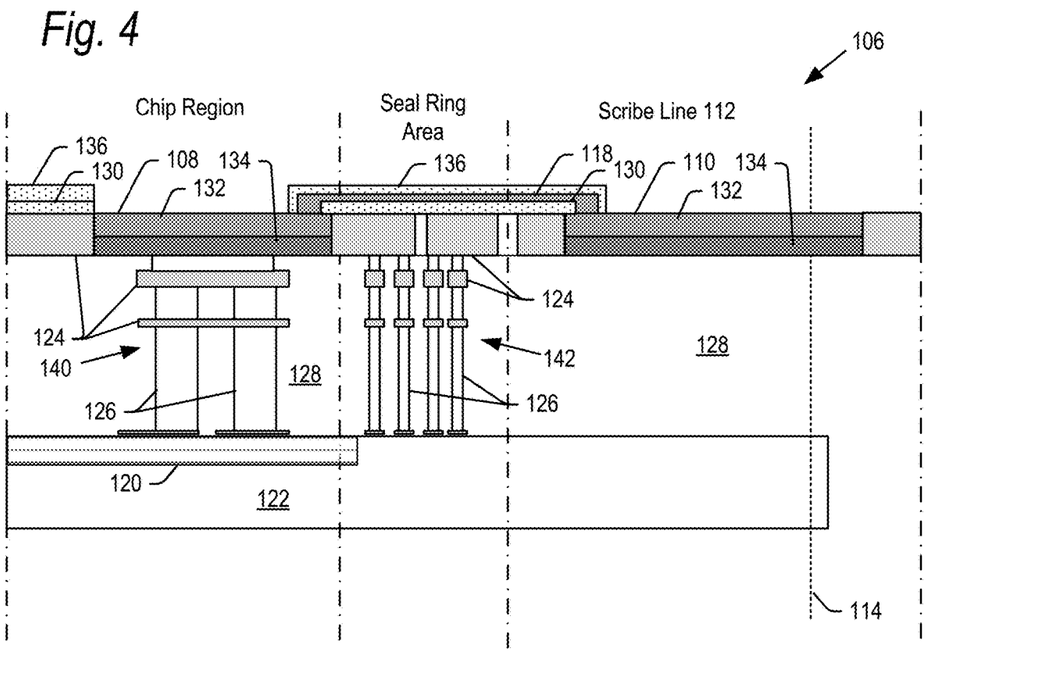
FIGS. 4 and 5 are cross-sectional edge and top views showing functional and dummy die bond pads, and internal components within the wafer according to aspects of the present technology.
Figure 5:
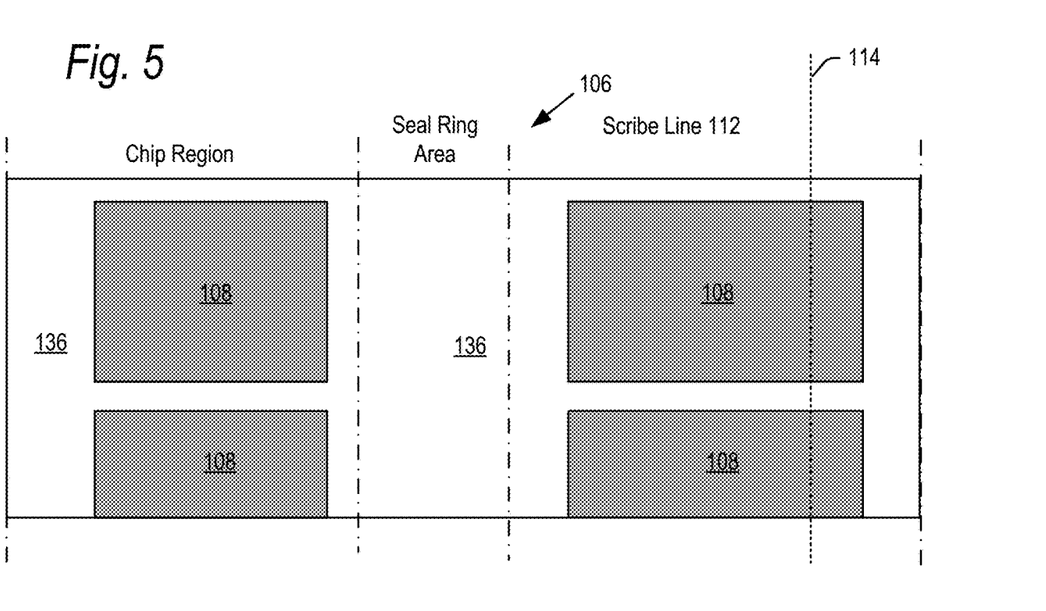

FIGS. 4 and 5 are cross-sectional side and top views of the wafer 100 at the proximal ends 106a of the semiconductor die 106 shown for example in FIG. 3. Each semiconductor die 106 may include integrated circuits 120 formed in and/or on a substrate layer 122 within a chip region of the semiconductor wafer. After formation of the integrated circuit 120, multiple layers of metal interconnects 124 and vias 126 may be formed sequentially in layers of a dielectric film 128. As is known in the art, the metal interconnects 124, vias 126 and dielectric film layers 128 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 124 may be formed of a variety of electrically conductive metals including for example copper and copper alloys as is known in the art, and the vias may be lined and/or filled with a variety of electrically conductive metals including for example tungsten, copper and copper alloys as is known in the art.

A passivation layer 130 may be formed on top of the upper dielectric film layer 128. The passivation layer 130 may be etched to form the functional die bond pads 108 and dummy die pads 110. Each die bond pad 108, 110 may include a contact layer 132 formed over a liner 134. As is known in the art, the contact layer 132 may be formed for example of copper, aluminum and alloys thereof, and the liner 134 may be formed for example of a titanium/titanium nitride stack such as for example Ti/TiN/Ti, though these materials may vary in further embodiments. The bond pads 108 (contact layer plus liner) may have a thickness of 720 nm, though this thickness may be larger or smaller in further embodiments.

The passivation layer 130 may serve as the base layer for the RDL traces 118. Once the passivation layer 130 has been etched to expose bond pads 108, 110, the RDL traces 118 may be formed over the passivation layer 130, between bond pads 108, 110, to electrically connect the bond pads 108 and 110. In embodiments, the RDL traces 118 may be formed of copper, aluminum or alloys thereof. In embodiments, a further passivation layer 136 may be formed over the RDL traces 118. The passivation layer 136 may be formed over the entire surface of wafer 100, with the exception of the functional and dummy die bond pads 108, 110, to provide a smooth, planar surface on the wafer 100 and the respective semiconductor die 106, as indicated in FIG. 5.

The metal interconnects 124 and vias 126 may be used to form conductive nodes 140 within the chip region for transferring signals and voltages between the functional die bond pads 108 and integrated circuits 120. The metal interconnects 124 and vias 126 may also be used to form a seal ring 142 within a seal ring area. The seal ring 142 may surround the integrated circuits 120 and conductive nodes 140, and provide mechanical support to prevent damage to the integrated circuits 120 and conductive nodes 140, for example during dicing of the wafer 100.

In the embodiments of FIGS. 3-5, the functional die bond pads 108 may be formed in the chip regions, inside of the seal ring areas and scribe lines 112 on wafer 100. The dummy die bond pads 110 may be formed in scribe lines 112, outside of the seal ring areas, on wafer 100. The chip regions and seal ring areas may together be referred to herein as the active area of a semiconductor die 106. FIGS. 3-5 also show dicing line 114 representing a line along which the semiconductor die 106 are cut from wafer 100. As shown, the dicing line 114 cuts through the dummy die bond pads 110 to leave a portion of the dummy die bond pads 110 at the edge of each semiconductor die 106 upon dicing from wafer 100.

Forming the semiconductor die 106 with functional die bond pads 108 and dummy die bond pads 110 provides two distinct advantages. First, forming die bond pads at the edge (106a) of the semiconductor die allows low height wire bond be formed as explained below, and also allows die 106 to be stacked with a small offset to provide a die stack with a small overall footprint as explained below.

It is conceivable that die 106 could be formed with a single (functional) die bond pad which extends partially into scribe lines 112 so that it is severed at the edge (106a) of the die when the wafer is diced. Such a die bond would extend over the integrated circuits 120 shown in FIG. 4, over the seal ring 142 and into scribe line 112. However, forming a die bond pad in such a way could adversely affect the structural integrity of the seal ring 142 when the die 106 was diced from the wafer along cutline 114 in scribe line 112. In particular, the passivation layer (130 and/or 136) over the seal ring 142 prevents the seal ring from being compromised by moisture and/or contaminants after the cut is made. Thus, the pair of die bond pads 108 and 110 allow a die bond pad at the edge of semiconductor die 106, while ensuring the seal ring 142 remains intact and structurally sound.

Figure 6:
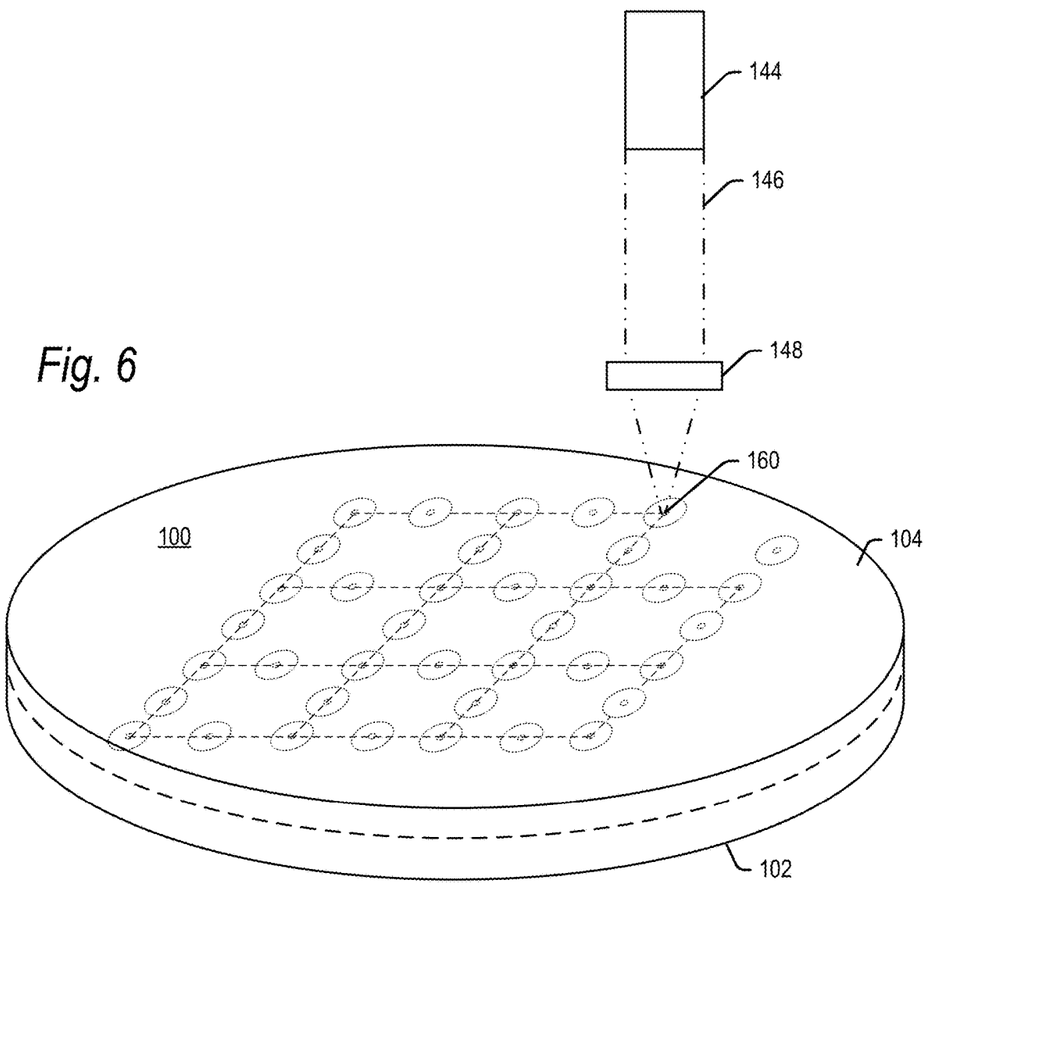
FIG. 6 illustrates a stealth dicing before grinding laser process for dicing a semiconductor wafer.

After formation of the integrated circuits 120 and metal conducting layers in steps 206 and 208, a layer of tape may be laminated onto the major surface 102 in step 210. The wafer 100 may then be turned over, and diced in step 212. Embodiments of the present technology dice the wafer 100 using a stealth dicing before grinding step. As shown in FIG. 6, the wafer 100 may be supported on a chuck or other support surface (not shown) with the second major surface 104 facing away from the support surface. A laser 144 may then emit a pulsed laser beam 146 at a wavelength that transmits through the second major surface 104 of the wafer 100, for example at infrared or near-infrared wavelengths. The pulsed laser beam may be focused to a point beneath the wafer's surface 104 using an optical system, for example including one or more collimating lenses 148. When the laser beam hits a peak power density at the focal point, the wafer absorbs the energy, and a pinpoint hole 160 is created beneath the wafer's surface.

The laser may be moved along the scribe lines 112 in a plane of the wafer and activated at a number of points so that a number of closely situated pinpoint holes 160 are formed at an intermediate depth of the wafer (between the first and second major surfaces 102, 104 of the wafer). The rows and columns of pinpoint holes 160 define the eventual shape of each semiconductor die 106 to be diced from wafer 100 as indicated by dashed lines in FIG. 6.

After the stealth dicing step 212, the wafer 100 may be diced or partially diced. The wafer may then be thinned in step 214 using a grinding wheel (not shown) applied to the second major surface 104. The grinding wheel may thin the wafer 100 from, for example, 780 µm to its final thickness of for example about 25 µm to 36 µm. It is understood that the wafer 100 may be thinner or thicker than this range after the backgrind step in further embodiments. In addition to thinning the wafer 100, the vibrations from the backgrind step may cause cracks at the pinpoint holes 160 to propagate toward the first and second major surfaces 102, 104 of the wafer 100 to complete the dicing along dicing lines 114 of any semiconductor die not fully diced after the stealth dice before grinding step.

It is understood that the wafer may be diced by methods other than stealth dice before grinding in further embodiments, including for example by saw, laser or waterjet cutting methods. In such embodiments, the wafer may be diced before or after the backgrind step.

After completion of the dicing step 212 and backgrind step 214, a layer of die attach film (DAF) adhered to a flexible dicing tape may be applied onto the second major surface 104 of the wafer 100 in step 216. The wafer 100 may then be turned over and supported on a chuck or other support surface, and the lamination tape on the first major surface 102 of the wafer 100 may be removed in step 218. Once on the chuck, the flexible dicing tape may be stretched along orthogonal axes to separate the individual semiconductor die 106 in step 220 to allow the individual semiconductor die 106 to be removed by a pick and place robot for inclusion in a semiconductor package. It is conceivable that the die 106 are not fully diced at completion of the backgrind step 214. In this event, stretching of the dicing tape in step 220 will complete dicing of the semiconductor die along the dicing lines 114.

Figure 7:
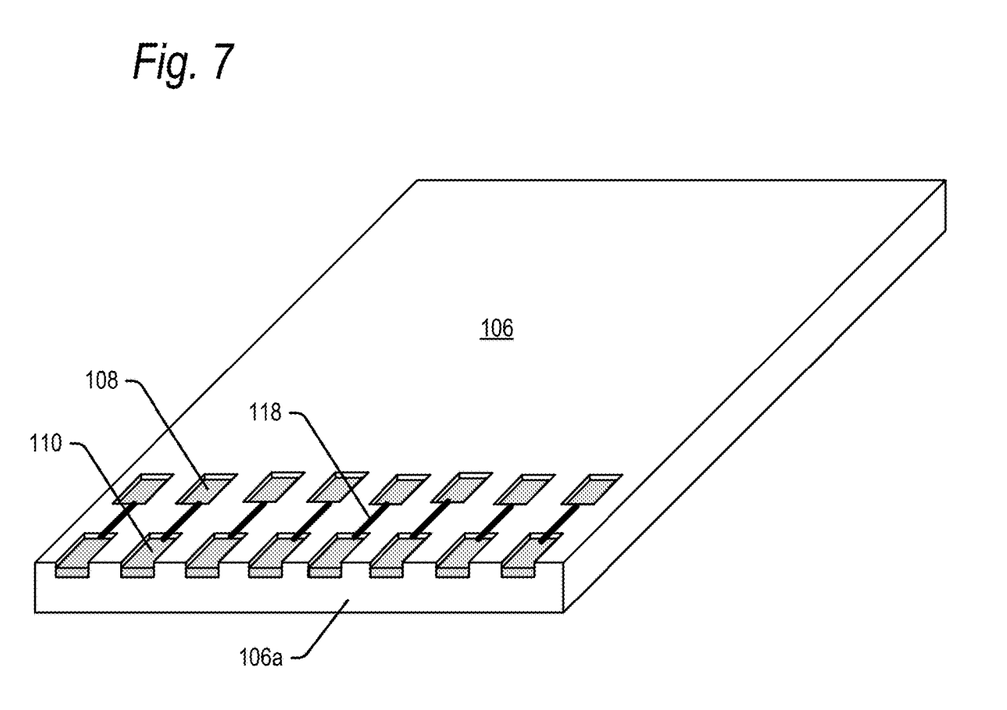
FIG. 7 illustrates a finished semiconductor die according to a first embodiment of the present technology.
Figure 8:
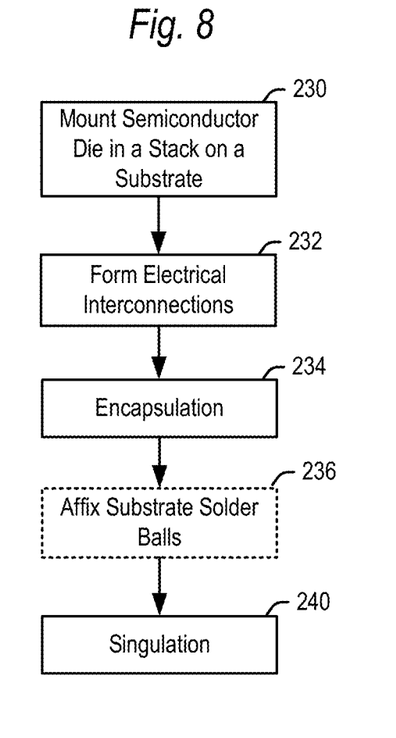
FIG. 8 is a flowchart for forming a semiconductor device according to embodiments of the present technology.

FIG. 7 shows a semiconductor die 106 after separation from wafer 100. The die 106 includes dummy die bond pads 110 at the proximal edge 106a, and functional die bond pads 108 spaced inward from the proximal edge 106a. Respective pairs of functional and dummy die bond pads are connected by RDL traces 118. The semiconductor die 106 may for example be memory die such a NAND flash memory die, but other types of die 106 may be used. These other types of semiconductor die include but are not limited to controller die such as an ASIC, or RAM such as an SDRAM.

Individual semiconductor die 106 may be packaged together to form a semiconductor device 170 as will now be explained with reference to the flowchart of FIG. 8 and the illustrations of FIGS. 9-14. In a step 230, a number of semiconductor die 106 may be stacked on a substrate 150 as shown in the perspective and cross sectional and views of FIGS. 9 and 10. Where multiple semiconductor die 106 are included, the semiconductor die 106 may be stacked atop each other in an offset stepped configuration to form a die stack 152.

Figure 9:
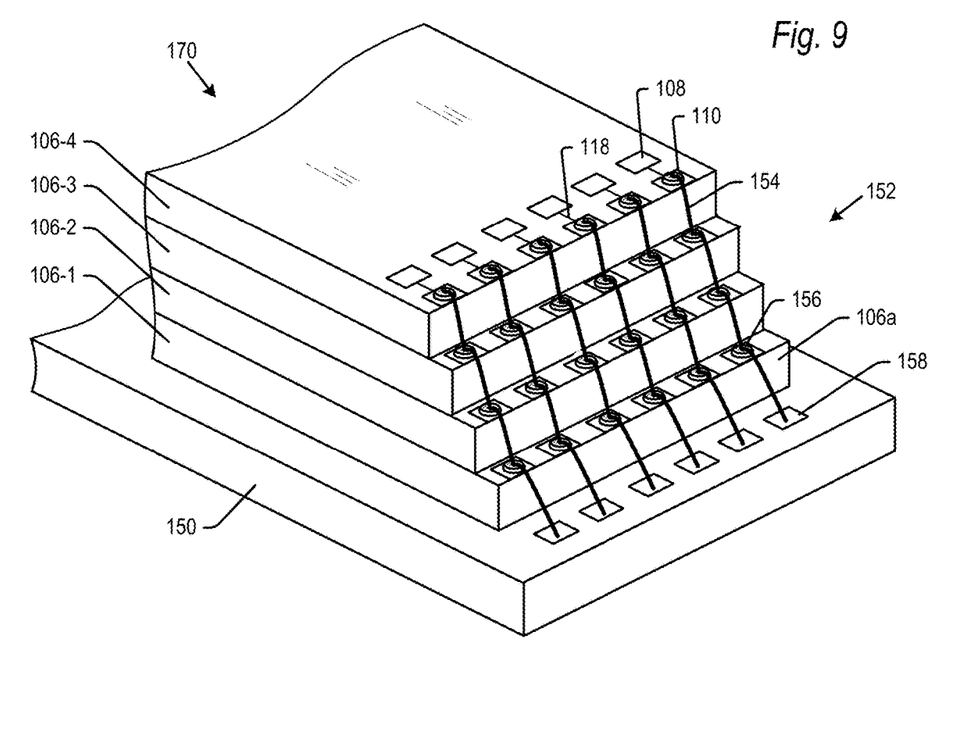
FIGS. 9 and 10 are perspective and cross-sectional edge views of a semiconductor package including stacked semiconductor die according to embodiments of the present technology.
Figure 10:
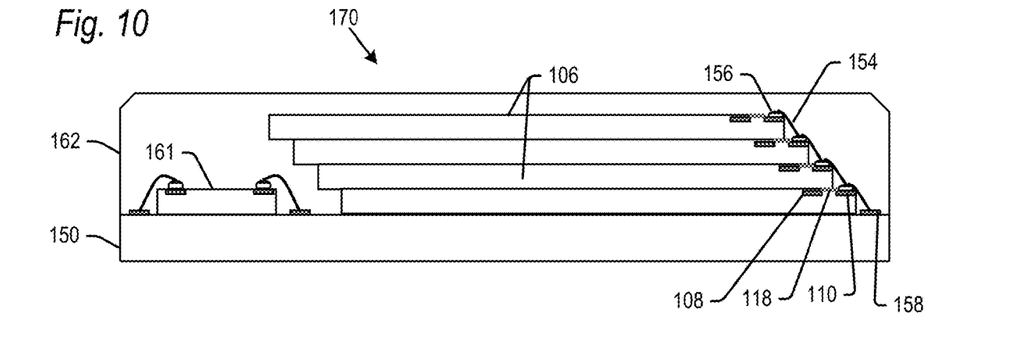

As seen in FIGS. 9 and 10, the semiconductor die 106 are stacked on top of each other so that each of the dummy die bond pads 110 remains exposed. However, as the dummy die bond pads 110 are located at the edge 106a of the semiconductor die, each die may be stacked close to the edge of the die below it, making for a minimal overall footprint of the die stack 152. Given the constant drive in flash memory devices to provide increased storage capacity in a smaller size, providing the die stack 152 with a small footprint is a significant advantage. For example, a first die 106 may be stacked on top of a second die 0 to 5 μm away from the row of dummy die bond pads 110 on the second die. This spacing may be greater than that in further embodiments. The functional die bond pads 108 are covered by the semiconductor die on the next level (for all semiconductor die 106 except for the uppermost semiconductor die). The upper passivation layer 136 (FIG. 4) provided a smooth, planar surface, so that the die 106 in stack 152 may lie flat against each other.

Embodiments may include different numbers of semiconductor die in die stack 152, including for example 1, 2, 4, 8, 16, 32 or 64 die. There may be other numbers of die in stack 152 further embodiments. The die may be affixed to the substrate and/or each other using a die attach film. As one example, the die attach film may be 8988UV epoxy from Henkel AG & Co. KGaA, cured to a B-stage to preliminarily affix the die 106 in the stack 152, and subsequently cured to a final C-stage to permanently affix the die 106 in the stack 152.

Although not shown, one or more passive components may additionally be affixed to the substrate 150. The one or more passive components may include for example one or more capacitors, resistors and/or inductors, though other components are contemplated.

The electrical interconnections between semiconductor die 106 and substrate 150 may be formed in step 232. As shown in FIGS. 9 and 10, semiconductor die 106 are electrically coupled to each other and the substrate 150 via wire bonds 154 (one of which is numbered in each of FIGS. 9 and 10) affixed to the dummy die bond pads 110 on each die 106 in stack 152.

As noted in the Background section, conventional wire bonds formed on die bond pads spaced from the edge of the die are formed with a large height loop to ensure the wire bond does not contact the edge of the semiconductor die as the opposite end of the wire bond is connected to the die below. Forming wire bonds 154 between the dummy die bond pads 110 at the very edge of each die 106 provides the advantage that the loop in wire bonds may be omitted, and the wire bonds to be formed with a minimal overall height. In fact, in embodiments, the wire bonds may contact the edge of the dummy die bond pad 110, as shown for example in FIG. 10. This provides an advantage of mechanical support for the wire bonds 154 by the edge of the dummy die bond pads 110, and prevents wire sweep. The wire bonds 154 may be low height, but not in contact with the edge of dummy die bond pads 110 in further embodiments.

Wire bonds 154 may be formed according to a number of schemes. However, in one embodiment, a wire bond capillary (not shown) forms a ball bump 156 on a first dummy die bond pad 110 of a first die 106-1. From there, the wire bond capillary pays out wire and forms a stitch bond on a contact pad 158 of substrate 150. The wire bond capillary may then break the wire, moves up to the first dummy die bond pad 110 of a second die 106-2, and forms a ball bump 156. From there, the wire bond capillary pays out wire and forms a stitch bond on top of the ball bump 156 on the first dummy die bond pad of die 106-1. This process continues up the die stack until the first dummy die bond pads 110 on die 106-1, 106-2, 106-3, 106-4, etc. are wire bonded to each other and substrate 150. This process is then repeated for each of the other dummy die bond pads across the die 106 in the semiconductor device 170. As noted, wire bonds 154 may be formed by other methods in further embodiments.

Upon completion of the wire bonds and fabrication of the package 170, signals may travel from an integrated circuit 120 to the functional die bond pad 108, from the functional die bond pad 108 to the dummy die bond pad 110 via RDL trace 118, and from dummy die bond pad 110 to the substrate 150 via wire bonds 154. Signals to an integrated circuit 120 may travel the reverse path.

The semiconductor device 170 shown in FIGS. 9 and 10 may further include a controller die 161 (FIG. 10), such as an ASIC, wire bonded to the substrate 150 for controlling the semiconductor die 106. The device 170 may be encapsulated in a mold compound 162 in step 234 as shown in FIG. 10. In step 236, solder balls (not shown) may optionally be affixed to a lower surface of substrate 150. In step 240, fabrication of the semiconductor device 170 may be completed by singulating respective semiconductor devices from a panel of such devices.

In embodiments described above, the connection between the functional die bond pads 108 and the dummy die bond pads 110 is made by RDL traces 118. This has the advantage that the functional die bond pads 108 and the RDL traces 118 may be recessed within a surface of the die 106, thus allowing them to be covered by a semiconductor die higher up in the die stack 152 as discussed above. However, it is understood that electrical connections between the functional and dummy die bond pads 108, 110 may be made by schemes other than RDL traces 118 and further embodiments.

Figure 11:
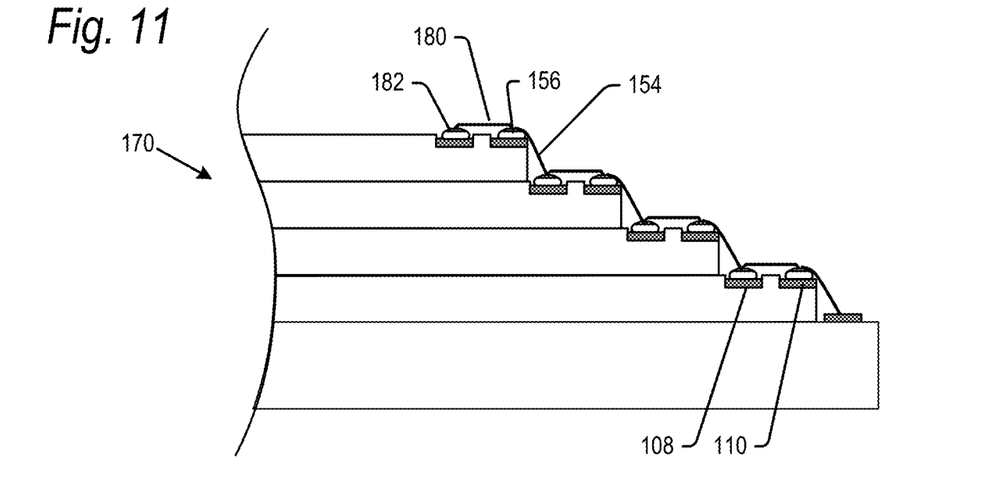
FIGS. 11-14 are edge views of a semiconductor package including semiconductor die formed according to alternative embodiments of the present technology.
Figure 12:
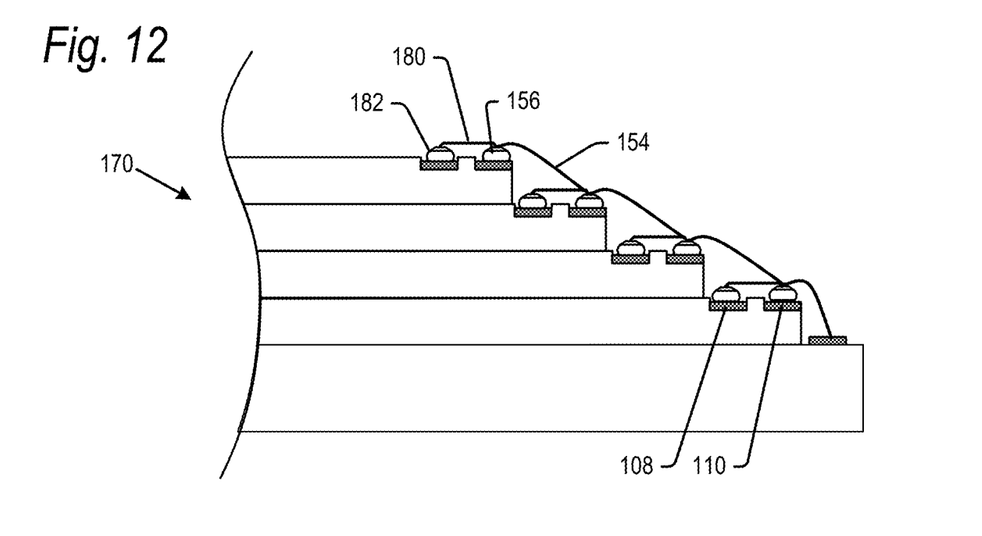

For example, FIGS. 11 and 12 are cross-sectional edge views showing further embodiments of a semiconductor device 170 where the RDL traces 118 are omitted, and the functional and dummy die bond pads 108, 110 are electrically connected by a wire bond 180. In particular, ball bumps 182 and 156 may be formed on the functional and dummy die bond pads 108 and 110, respectively. The functional and dummy die bond pads may then be electrically interconnected by forming a wire bond 180 between the ball bumps 182 and 156. Wire bonds 154 may then be formed between the ball bump 156 and dummy die bond pad 110 on a first die to the ball bump 182 and functional die bond pad 108 on the next lower die 106, as shown in FIG. 11. Alternatively, wire bonds 154 may be formed between the ball bump 156 and dummy die bond pad 110 on a first die to the ball bump 156 and dummy die bond pad 110 on the next lower die 106, as shown in FIG. 12. Other aspects of the semiconductor device 170 may be as described above.

Figure 13:
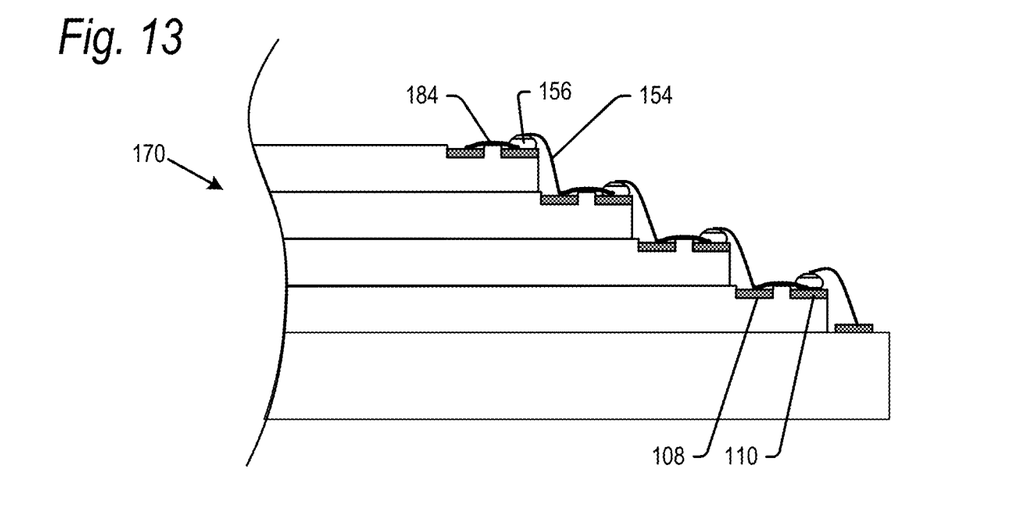
Figure 14:
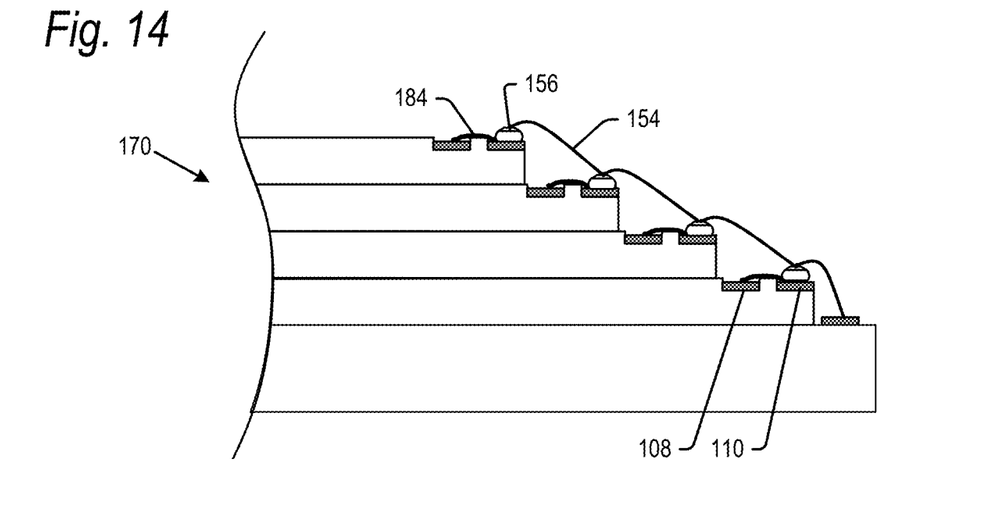

FIGS. 13 and 14 show a further embodiment of the present technology. The semiconductor devices 170 in FIGS. 13 and 14 are similar to semiconductor devices 170 in FIGS. 11 and 12, respectively, except that the wire bond 180 between the functional and dummy die bond pads 108, 110 is omitted and instead replaced by a printed electrical trace 184. In particular, printers are known which are capable of printing conductive traces 184 on surfaces, including on die 106 between the functional die bond pad 108 and the dummy die bond pad 110. The conductive traces 184 to be formed at the wafer level, or after the semiconductor die 106 are diced from the wafer 100. Other aspects of the semiconductor device 170 may be as described above.

In summary, an example of the present technology relates to a semiconductor wafer comprising: a first major surface; a second major surface opposed to the first major surface; a plurality of semiconductor die comprising integrated circuits formed in the first major surface of the wafer; a scribe lines comprising first and second sets of scribe lines, the first and second sets of scribe lines defining designated areas within which semiconductor die of the plurality of semiconductor die are separated from each other along dicing lines; a set of functional die bond pads electrically connected to the integrated circuits by metal interconnects within the semiconductor wafer; and a set of dummy die bond pads adjacent the set of functional die bond pads, the set of dummy die bond pads formed within the scribe lines.

In another example, the present technology relates to a semiconductor die, comprising: a first major surface; a second major surface opposed to the first major surface; integrated circuits formed adjacent the first major surface in an active area; a set of functional die bond pads spaced inward from an edge of the semiconductor die and electrically connected to the integrated circuits by metal interconnects within the active area; and a set of dummy die bond pads at the edge of the semiconductor die and adjacent the set of functional die bond pads, the set of dummy die bond pads configured to receive a wire bond.

In a further example, the present technology relates to a semiconductor device, comprising: a substrate; a plurality of stacked semiconductor die mounted to the substrate, a semiconductor die of the stacked semiconductor die comprising: integrated circuits formed adjacent the first major surface within an active area, a set of functional die bond pads spaced inward from an edge of the semiconductor die and electrically connected to the integrated circuits by metal interconnects within the active area, and a set of dummy die bond pads at the edge of the semiconductor die and adjacent the set of functional die bond pads; and a plurality of wire bonds having a first end electrically coupled to the set of dummy die bond pads.

In another example, the present technology relates to a semiconductor die formed from a semiconductor wafer, the semiconductor die comprising: a first major surface; a second major surface opposed to the first major surface; integrated circuits formed adjacent the first major surface within an active area; first pad means for transferring signals to and from the integrated circuits via metal interconnects beneath the first major surface; and second pad means for receiving a wire bond, the second pad means being adjacent the first pad means.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor die, comprising:
   a first major surface;
   a second major surface opposed to the first major surface;
   integrated circuits formed adjacent the first major surface in an active area;
   a set of functional die bond pads spaced inward from an edge of the semiconductor die and electrically connected to the integrated circuits by metal interconnects within the active area;
   a set of dummy die bond pads at the edge of the semiconductor die and adjacent the set of functional die bond pads, the set of dummy die bond pads configured to receive a first set of bond wires; and
   a second set of bond wires electrically interconnecting respective pairs of functional die bond pads from the set of functional die bond pads and dummy die bond pads from the set of dummy die bond pads.

2. The semiconductor die of claim 1, wherein the set of dummy die bond pads have a severed edge.

3. The semiconductor die of claim 1, further comprising at least one passivation layer in a space between the set of functional die bond pads and the set of dummy die bond pads.

4. The semiconductor die of claim 1, wherein the set of functional die bond pads are positioned over the integrated circuits formed beneath a surface of the semiconductor die.

5. The semiconductor die of claim 1, further comprising a seal ring formed beneath a surface of the semiconductor die, the set of functional die bond pads spaced inward from the edge of the semiconductor die a greater amount than an amount by which the seal ring is spaced inward from the edge of the semiconductor die.

6. The semiconductor die of claim 5, further comprising one or more passivation layers formed on a surface of the semiconductor die over the seal ring.

7. The semiconductor die of claim 1, wherein the integrated circuits are integrated circuits for flash memory.

8. A semiconductor device, comprising:
   a substrate;
   a plurality of stacked semiconductor die mounted to the substrate, a semiconductor die of the stacked semiconductor die comprising:
      integrated circuits formed adjacent the first major surface,
      a set of first die bond pads spaced inward from an edge of the semiconductor die and electrically connected to the integrated circuits by metal interconnects, and
      a set of second die bond pads at the edge of the semiconductor die and adjacent the set of first die bond pads; and
   a plurality of wire bonds having a first end electrically coupled to the set of second die bond pads.

9. The semiconductor device of claim 8, wherein the plurality of stacked semiconductor die are stacked in an offset configuration.

10. The semiconductor device of claim 9, wherein the plurality of stacked semiconductor die comprise a first semiconductor die at a top of the stack and a second semiconductor die below adjacent to the first semiconductor die, wherein the set of first die bond pads in the second semiconductor die are covered beneath the first semiconductor die in the stack.

11. The semiconductor device of claim 8, further comprising an electrical connector electrically connecting pairs of the set of first die bond pads and the set of second die bond pads.

12. The semiconductor device of claim 8, wherein the semiconductor die comprises a first semiconductor die, the semiconductor device further comprising a second semiconductor die of the stacked semiconductor die, the second semiconductor die comprising:
 a second set of integrated circuits formed adjacent the first major surface,
 a second set of first die bond pads spaced inward from an edge of the semiconductor die and electrically connected to the second set of integrated circuits by metal interconnects, and
 a second set of second die bond pads at the edge of the semiconductor die and adjacent the second set of first die bond pads.

13. The semiconductor device of claim 12, wherein the plurality of wire bonds have a second end, opposite the first end, the second end electrically coupled to the second set of second die bond pads on the second semiconductor die.

14. The semiconductor device of claim 12, wherein the plurality of wire bonds have a second end, opposite the first end, the second end electrically coupled to the second set of function die bond pads on the second semiconductor die.

15. A semiconductor die, comprising:
 a first major surface;
 a second major surface opposed to the first major surface;
 integrated circuits formed adjacent the first major surface in an active area;
 a set of functional die bond pads spaced inward from an edge of the semiconductor die and electrically connected to the integrated circuits by metal interconnects within the active area;
 a set of dummy die bond pads at the edge of the semiconductor die and adjacent the set of functional die bond pads, the set of dummy die bond pads configured to receive a bond wire; and
 a seal ring formed beneath a surface of the semiconductor die, the set of functional die bond pads spaced inward from the edge of the semiconductor die a greater amount than an amount by which the seal ring is spaced inward from the edge of the semiconductor die.

16. The semiconductor die of claim 15, further comprising one or more passivation layers formed on a surface of the semiconductor die over the seal ring.

17. The semiconductor die of claim 15, wherein the set of dummy die bond pads have a severed edge.

18. The semiconductor die of claim 15, wherein the integrated circuits are formed beneath a surface of the semiconductor die and the set of functional die bond pads are positioned over the integrated circuits.

19. The semiconductor die of claim 15, further comprising electrical conductors electrically interconnecting respective pairs of functional die bond pads from the set of functional die bond pads and dummy die bond pads from the set of dummy die bond pads.

20. The semiconductor die of claim 19, wherein the electrical conductors comprise redistribution layer traces.

21. The semiconductor die of claim 19, wherein the electrical conductors comprise conductive traces printed onto a surface of the semiconductor die.

22. The semiconductor die of claim 19, wherein the electrical conductors comprise bond wires.

* * * * *